(12) United States Patent
Lin et al.

(10) Patent No.: US 11,158,836 B2
(45) Date of Patent: Oct. 26, 2021

(54) LIGHT EMITTING DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/358,676

(22) Filed: Mar. 19, 2019

(65) Prior Publication Data
US 2020/0303676 A1 Sep. 24, 2020

(51) Int. Cl.
*H01L 51/52* (2006.01)
*H01L 51/50* (2006.01)
*H01L 27/32* (2006.01)

(52) U.S. Cl.
CPC ........ *H01L 51/5253* (2013.01); *H01L 27/322* (2013.01); *H01L 27/3211* (2013.01); *H01L 51/502* (2013.01); *H01L 51/5265* (2013.01); *H01L 27/3258* (2013.01)

(58) Field of Classification Search
CPC ............... H01L 51/5253; H01L 51/502; H01L 51/5265; H01L 27/322; H01L 27/3211
See application file for complete search history.

(56) References Cited

U.S. PATENT DOCUMENTS

| | | | |
|---|---|---|---|
| 2014/0291623 A1* | 10/2014 | Choi | H01L 27/3246 257/40 |
| 2017/0186819 A1 | 6/2017 | Yun | |
| 2017/0250318 A1* | 8/2017 | Cha | H01L 33/505 |
| 2018/0158886 A1* | 6/2018 | Dong | H01L 27/3246 |
| 2018/0182931 A1* | 6/2018 | Lee | H01L 33/50 |
| 2018/0190625 A1* | 7/2018 | Steckel | G02F 1/133603 |
| 2018/0240822 A1 | 8/2018 | lee | |
| 2019/0067533 A1* | 2/2019 | Chen | H01L 33/508 |
| 2019/0214376 A1* | 7/2019 | Kim | H01L 25/167 |
| 2020/0006612 A1* | 1/2020 | Lee | H01L 33/46 |
| 2020/0006697 A1* | 1/2020 | Jung | H01L 51/5256 |
| 2020/0091464 A1* | 3/2020 | Park | H01L 51/5237 |
| 2020/0106042 A1* | 4/2020 | Won | C23C 14/042 |
| 2020/0212135 A1* | 7/2020 | Zhang | H01L 27/3225 |

* cited by examiner

Primary Examiner — Dung A. Le
(74) Attorney, Agent, or Firm — Winston Hsu

(57) ABSTRACT

A light emitting device includes a plurality of light emitting elements, a plurality of color conversion elements and a protective layer. The plurality of color conversion elements are disposed on at least a portion of the plurality of light emitting elements. The protective layer is disposed on the plurality of color conversion elements and has a multilayer structure.

20 Claims, 16 Drawing Sheets

LIGHT EMITTING DEVICE

BACKGROUND OF THE DISCLOSURE

1. Field of the Disclosure

The present disclosure relates to a light emitting device, and more particularly, to a light emitting device which includes a protective layer in a form of a multilayer structure.

2. Description of the Prior Art

The reliability of quantum dot (QD) materials is not good enough in electronic devices. Exposure to moist or oxygen deteriorates the performance of the quantum dots and causes the quantum dots to fail to operate normally. The conventional QD-OLED structures cannot effectively protect the quantum dots from damages because the protection layer for QD in various QD-OLED structures is very demanding.

In the QD-OLED manufacturing process, requirements for light resistance, for heat resistance, for water resistance, for oxygen resistance, and for chemical resistance are challenging and needed. Therefore, the industry suffers serious problems that a QD layer in various QD-OLED structures is not well protected by the protection structure from the damages of light, heat, moist, oxygen and chemicals.

SUMMARY OF THE DISCLOSURE

The present disclosure provides a light emitting device which includes a plurality of light emitting elements, a plurality of color conversion elements and a protective layer. The plurality of color conversion elements are disposed on at least a portion of the plurality of light emitting elements. The protective layer is disposed on the plurality of color conversion elements and has a multilayer structure.

The present disclosure will no doubt become obvious to those of ordinary skill in the art after reading the following detailed description with respect to various embodiments and examples which are illustrated in figures and in drawings.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

When an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following can be replaced, recombined, or mixed with one another to constitute another embodiment without departing from the spirit of the present disclosure.

Figure 1A:
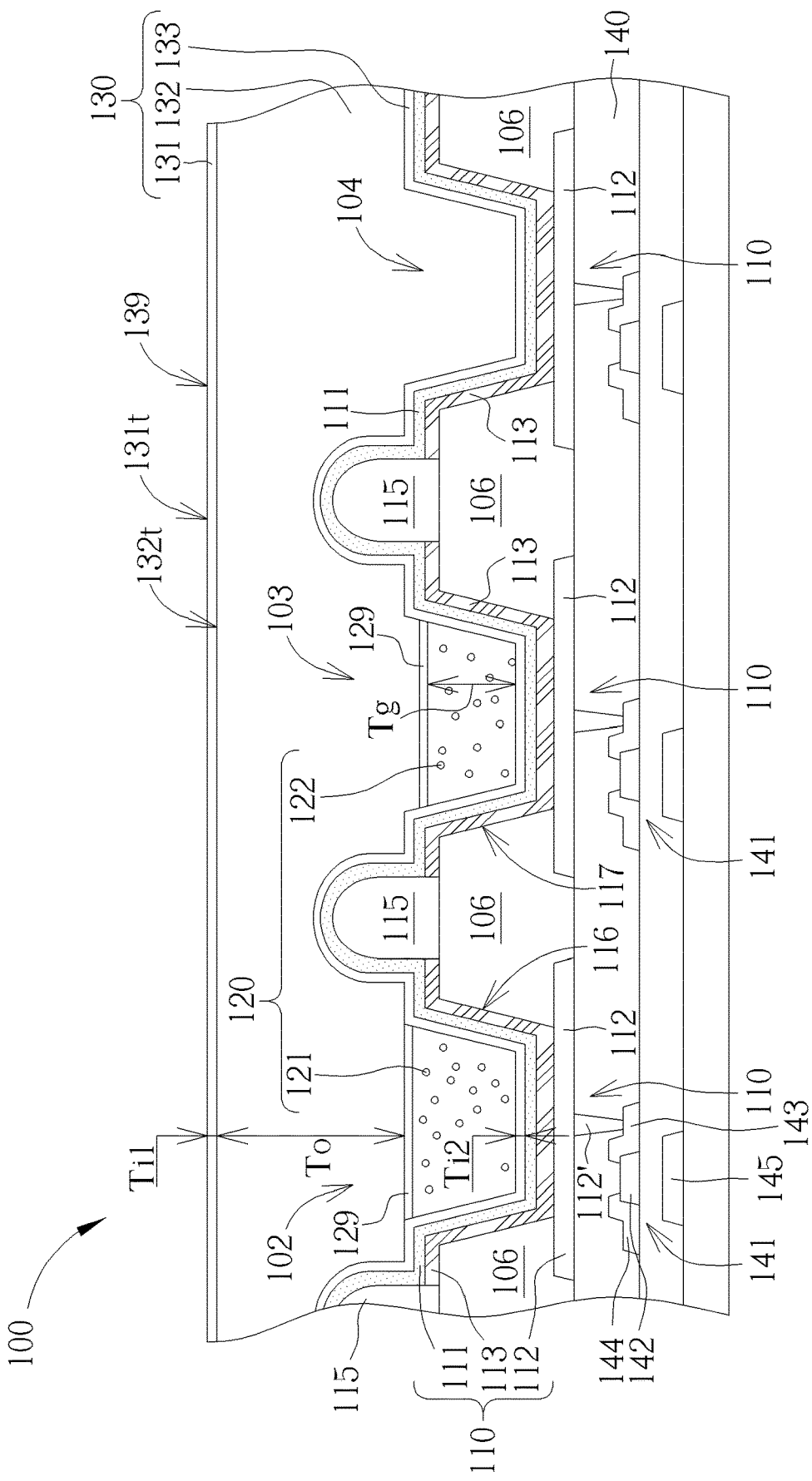
FIG. 1A is a schematic diagram illustrating a cross-sectional view of a light emitting device according to an embodiment of the present disclosure.

FIG. 1A is a schematic diagram illustrating a cross-sectional view of a light emitting device 100 according to an embodiment of the present disclosure. The light emitting device 100 may include a plurality of light emitting elements 110, a pixel defining layer (PDL) 106, a plurality of spacers 115, a plurality of color conversion elements 120 and a protective layer 130, but is not limited thereto. The spacers 115 may optionally be disposed corresponding to the pixel defining layer (PDL) 106 such that they will not shield the light emitting regions.

In one embodiment, the light emitting elements 110 may be organic light-emitting diodes (OLED), light-emitting diodes (LED), micro LEDs, mini LEDs or quantum dot light-emitting diodes (QLEDs), but not limited thereto. A light emitting element 110 may emit blue light of a main peak (maximum peak) wavelength in a range of 440 nm to 470 nm for blue rays pumping, or the main peak wavelength (maximum peak) in the range of 450 nm±10 nm for better optical performance.

In another embodiment, a light emitting element 110 may emit mixed rays. For example, the mixed rays are formed by mixing blue light having the main peak wavelength (maximum peak) in the range from 461 nm to 473 nm and another blue light having the main peak wavelength (maximum peak) in the range from 440 nm to 460 nm wherein the light emitting element 110 may include two light emitting components (such as light emitting layers) in a stack structure, one of them can emit the blue light having the main peak (maximum peak) wavelength at about 450 nm, and another one can emit the blue light having the main peak (maximum peak) wavelength at about 467 nm. These light emitting components may be stacked vertically or disposed horizontally (e.g. side by side) within one electronic unit. In some embodiments, the light emitting element 110 may include one or more light emitting components.

A light emitting element 110 may include a first electrode layer 111, a second electrode layer 112, and a light emitting layer 113. When the light emitting element 110 is an OLED, the light emitting layer 113 may include, but not limited to, a hole injection layer (HIL), a hole transport layer (HTL), an emissive layer (EL), an electron transport layer (ETL), an electron injection layer (EIL) and/or a charge generating layer (CGL) for example. The emissive layer may include a suitable organic light emitting material and is useful for pumping suitable blue light. Further, the first electrode layer 111 may be one of a cathode and an anode, and the second electrode layer 112 may be a corresponding anode or cathode, depending on the type of the first electrode layer 111. The light emitting layer 113 may contact or may not contact the adjacent spacer 115.

The second electrode layer 112 may be disposed on a passivation layer 140, a connection element 112' may penetrate through the passivation layer 140 to electrically connect the second electrode layer 112 to a transistor 141 of the light emitting device 100. In one embodiment, the second electrode layer 112 may be formed along with the connection element 112' at the same time to be one integrally formed element. In another embodiment, the second electrode layer 112 may be formed after the formation of the connection element 112'.

For example, the transistor 141 may be a thin film transistor (TFT) in charge of the on/off state of the above light emitting element 110. The first electrode layer 111 and the second electrode layer 112 which is electrically connected to a transistor 141 to control the on/off state of the corresponding light emitting element 110. In other embodiments, the above layers may be optionally added or removed depending on the situation, and they are not limited thereto. The first electrode layer 111 may be a common electrode for a plurality of light emitting elements 110.

TFTs 141 may serve as switch elements for driving the light emitting elements 110 in the light emitting device 100. The TFTs 141 may include a semiconductor layer 142, a drain electrode 143, a source electrode 144, and a gate electrode 145. The semiconductor layer comprises a semiconductor material, such as silicon or metal oxide, but not limited thereto. For example, the semiconductor layer may comprise amorphous silicon, polysilicon, or indium gallium zinc oxide (IGZO). The semiconductor layer may include a source contact, a drain contact, and a channel disposed between the source contact and the drain contact in one TFT 141. The drain electrode and the source electrode are electrically connected to the semiconductor layer respectively. The gate electrode is separated from the channel by a gate dielectric layer. The gate electrode, the source electrode and the drain electrode may comprise conductive materials (such as metal, but not limited thereto). It should be noted that the structure of the TFTs 141 shown in FIG. 1 is merely an example and is not meant to limit the possible types or structures of the TFTs 141 of the present disclosure, and any other suitable TFT structures may replace the illustrated TFTs 141. For example, top-gate type TFTs or bottom-gate type TFTs may be used as the TFTs 141 in a variant embodiment.

Figure 1B:
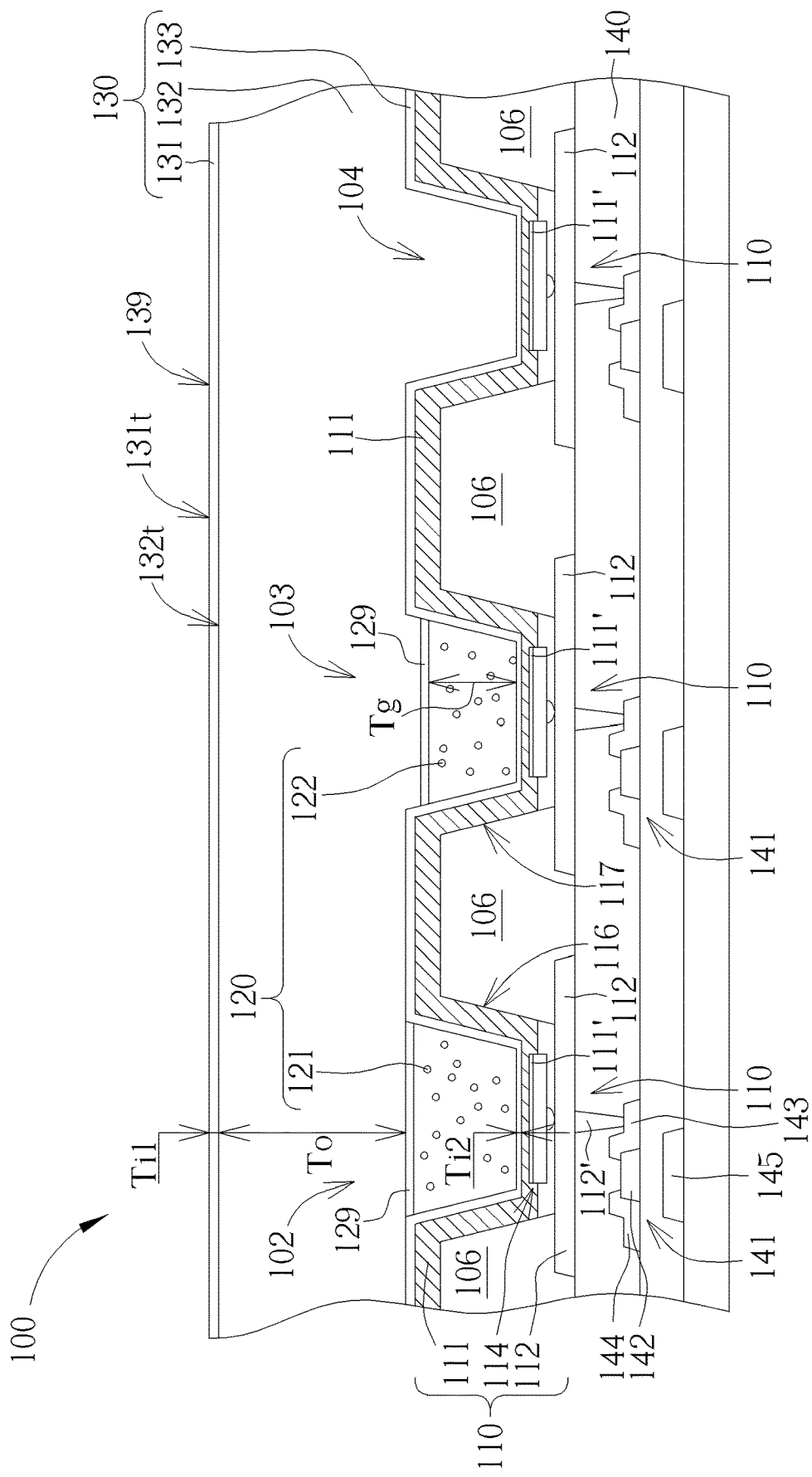
FIG. 1B is a schematic diagram illustrating a cross-sectional view of a light emitting device according to another embodiment of the present disclosure.

FIG. 1B is a schematic diagram illustrating a cross-sectional view of a light emitting device according to a variant first embodiment of the present disclosure. In FIG. 1B, a plurality of light emitting elements 110 may include a plurality of micro LEDs or mini LEDs 114, a cathode 111' and an anode layer 112 in the absence of a spacer. In other words, the second electrode layer may be the anode layer 112. The micro LEDs or mini LEDs 114 are in the form of a vertical type and may share a common cathode layer, i.e. the first electrode layer 111 for example, atop the micro LEDs or mini LEDs 114.

Figure 1C:
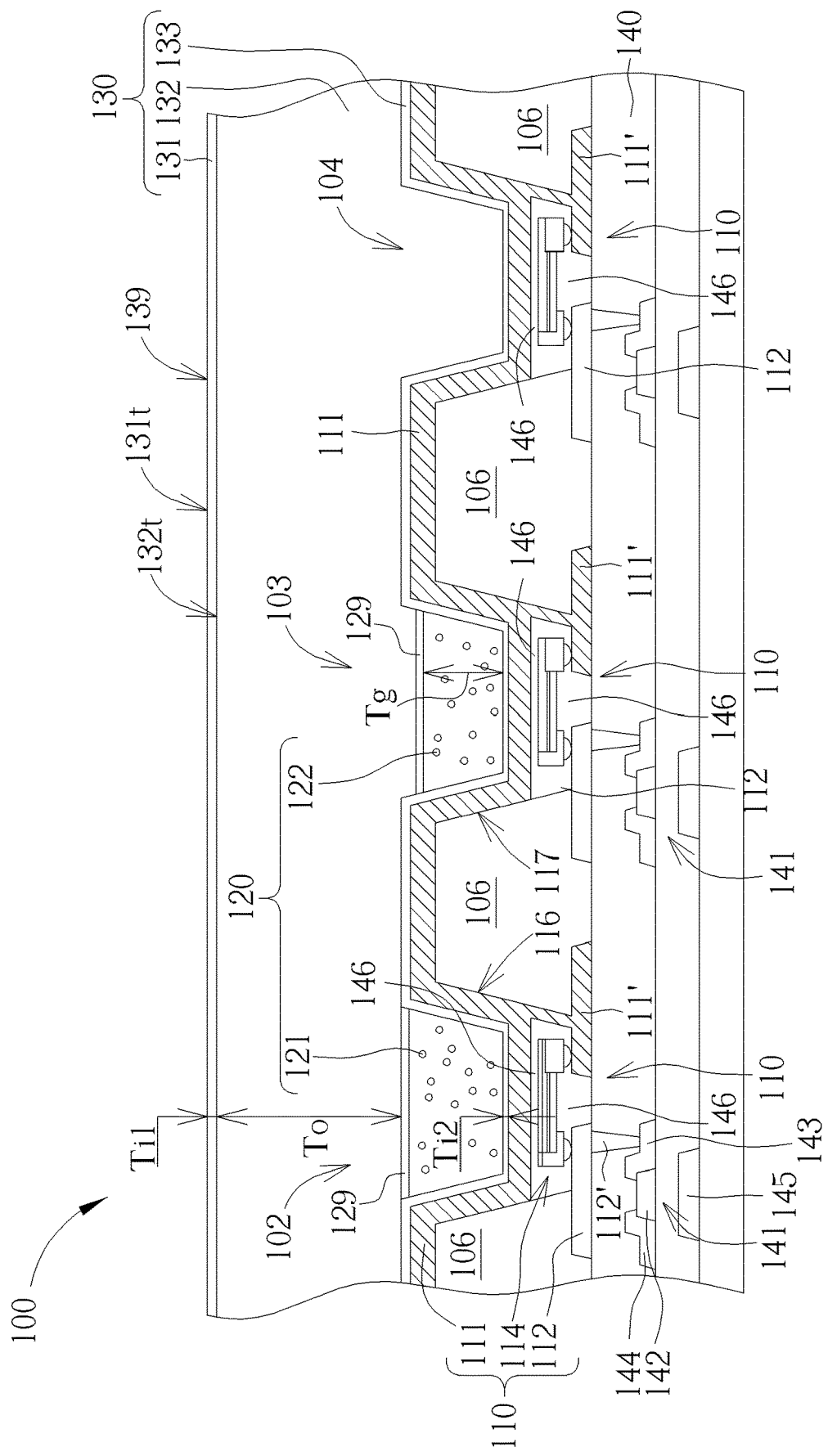
FIG. 1C is a schematic diagram illustrating a cross-sectional view of a light emitting device according to another variant embodiment of the present disclosure.

FIG. 1C is a schematic diagram illustrating a cross-sectional view of a light emitting device according to another variant first embodiment of the present disclosure. In FIG. 1C, a plurality of light emitting elements 110 may include a plurality of micro LEDs or mini LEDs 114, a cathode 111' and an anode layer in the absence of a spacer. For example, the second electrode layer 112 may be the anode layer. The micro LEDs or mini LEDs 114 are in the form of a flip-type and may share a common cathode layer, i.e. the first electrode layer 111 for example, atop the micro LEDs or mini LEDs 114. Both the cathode 111' and the anode layer are disposed under the pixel defining layer (PDL) 106 and accordingly co-planar. The micro LEDs or mini LEDs 114 may be disposed within an insulating layer 146.

The color conversion elements 120 may be wavelength conversion elements to adjust the output light of the light emitting device 100. For example, the color conversion elements 120 may include quantum dots, phosphor material, a dye or a color filter. The quantum dots may be made of a semiconductor nano-crystal structure, and can include CdSe, CdS, CdTe, ZnSe, ZnTe, ZnS, HgTe, InAs, $Cd_{1-x}Zn_xSe_{1-y}S_y$, CdSe/ZnS, InP, and GaAs, but not limited thereto. Quantum dots generally have a particle size between 1 nm and 30 nm, 1 nm and 20 nm, or 1 nm and 10 nm. When quantum dots 121, 122 are excited by input light, the input light will be converted into an emitted light with other colors by quantum dots. The colors of the emitted light may be adjusted by the material or size of the quantum dots. In some embodiments, the quantum dots may include sphere particles, rod particles or particles with any other suitable shapes as long as the quantum dots could emit light with suitable color. The color conversion elements 120 may be useful for outputting visible light. For example, the color conversion element 120 may output blue light, cyan light, green light, yellow light, red light or a combination thereof. In the present disclosure, the above output light could be regarded as the final visual light of the light emitting device 100 perceived by the user (observer).

The plurality of color conversion elements 120 may be disposed on at least a portion of the plurality of light emitting elements 110 and defined by a pixel defining layer (PDL) 106. In one embodiment, the plurality of color conversion elements 120 are disposed on the plurality of light emitting elements 110 respectively. For example, a color conversion element 120 is disposed on a light emitting element 110, but not limited thereto. In another embodiment, the plurality of color conversion elements 120 are disposed on only a portion of the plurality of light emitting elements 110. Or in still another embodiment, not every light emitting element 110 has a color conversion element 120 disposed thereon, but not limited thereto.

The protective layer 130 is disposed on the plurality of color conversion elements 120 to keep the light emitting elements 110, or the color conversion elements 120 from damages, such as the damages which are caused by moist or oxygen. The protective layer 130 is in a form of a multilayer structure, such as a stack structure including multiple layers. In one embodiment, the protective layer 130 has a top surface 139. For example, the protective layer 130 may include at least one inorganic layer 131 of a thickness Ti1 and at least one organic layer 132 of a thickness To. The inorganic layer 131 may be a functional inorganic layer and the organic layer 132 may be a functional organic layer.

In another embodiment, at least one inorganic layer 133 of a thickness Ti2 in the protective layer 130 may conformally cover the light emitting elements 110 so that such inorganic layer 133 in the protective layer 130 may not flat. In still another embodiment, if one inorganic layer 131 is atop an organic layer 132 with a top surface 132t, such inorganic layer 131 may accordingly have a surface 131t as well. One organic layer 132 may stack on one inorganic layer 133 or one inorganic layer 131 may be disposed on one organic layer 132. There may be another inorganic layer 129 disposed between the protective layer 130 and the color conversion elements 120. Each thickness Ti1, To or Ti2 may be determined above or under the color conversion element 120.

The organic layer 132 may comprise an organic material and provide a surface for the inorganic layer 131 atop the organic layer 132 to make the inorganic layer 131 have a surface as well. For example, the organic layer 132 may be a color filter layer of a thickness of 2 μm to 3 μm to facilitate the improvement of the optical performance of the light emitting device 100, but not limited thereto. Or alternatively, the organic layer 132 may comprise a transparent polymeric material. For example, the polymeric material may comprise an acrylic material or a meth-acrylic material.

Figure 2:
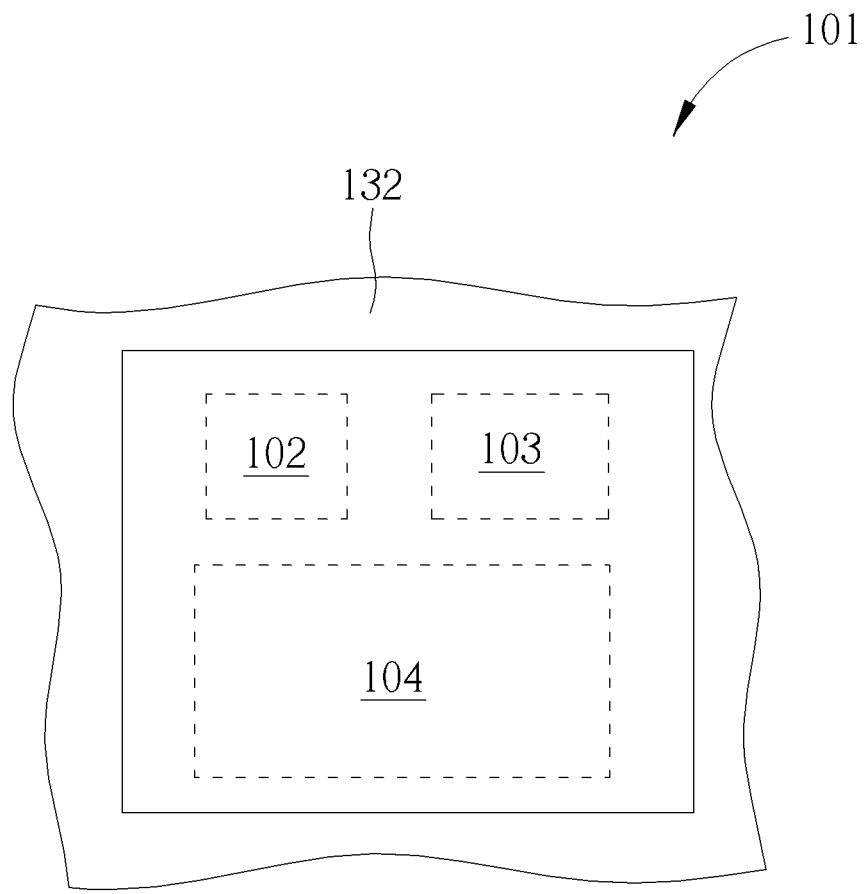
FIG. 2 is a schematic diagram illustrating a top view of a pixel in a light emitting device according to another embodiment of the present disclosure.

FIG. 2 is a schematic diagram illustrating a top view of a pixel 101 in a light emitting device 100 according to another embodiment of the present disclosure. Generally speaking, the organic layer 132 may stand astride at least two sub-pixels, for example a red sub-pixel 102, a green sub-pixel 103, or further stand astride a blue sub-pixel 104, or stand astride three or more sub-pixels so a pixel 101 may have three or more sub-pixels of different colors. The protective layer 130 is transparent with respect to a specific wavelength of light, for example blue light, cyan light, green light, yellow light or red light.

Figure 3:
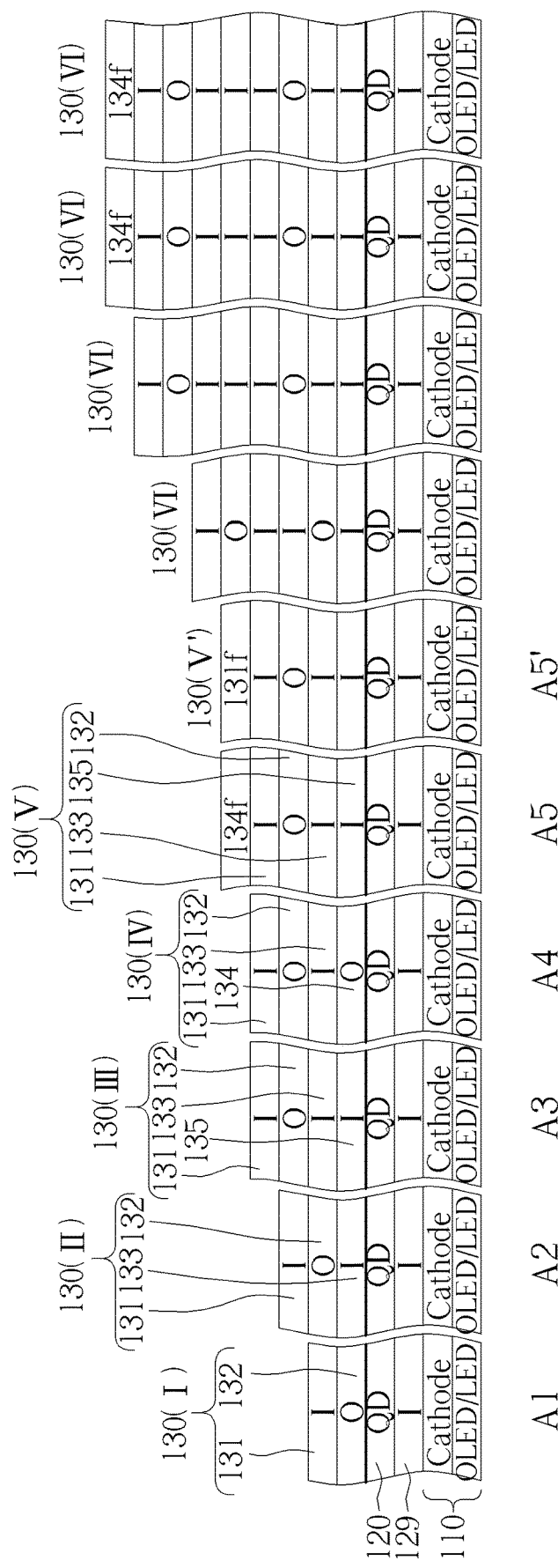
FIG. 3 is a schematic diagram illustrating a cross-sectional view of a protective layer according to other variant embodiments of the present disclosure.

FIG. 3 is a schematic diagram illustrating a cross-sectional view of a protective layer 130 according to variant embodiments of the present disclosure. In a variant embodiment A1 of the present disclosure, the protective layer 130(I) may consist of one organic layer 132 and one inorganic layer 131 atop the organic layer 132. This configuration has the simplest structure which meets the requirement of the protective layer 130 of the present disclosure. In another variant embodiment A2, the protective layer 130(II) may consist of one organic layer 132 which is sandwiched between a first inorganic layer 131 and a second inorganic layer 133. The top inorganic layer 131 in this configuration may serve as a shield of the organic layer 132 to make it harmlessly pass process steps in a later stage. The organic layer 132 in this configuration may provide the inorganic layer 131 with a bottom and a robust support. The bottom inorganic layer 133 in this configuration may serve as a buffer layer between the organic layer 132 and the color conversion element 120.

In another variant embodiment A3, the protective layer 130(III) may include three inorganic layers 131, 133, 135. In another variant embodiment A4, the protective layer 130 (IV) may include at least two organic layers 132, 134 and at least two inorganic layers 131, 133. In another variant embodiment A5, the protective layer 130(V) may include a functional organic layer 134$f$ to be the topmost layer. For example, the functional organic layer 134$f$ may be a color filter layer. In another variant embodiment A5', the protective layer 130(V') may include a functional inorganic layer 131$f$ to be the topmost layer. For example, the functional inorganic layer 131$f$ may be a distributed Bragg reflector (DBR) layer. In other variant embodiments, the protective layer (VI) may include six to nine layers with alternating inorganic layers I and organic layers O.

In the variant embodiments of the protective layer 130, the thickness of the organic layer 132 may be greater than that of the inorganic layer 131. Or, the thickness of the first inorganic layer 131 may be equal to or different from that of the second inorganic layer 133. In one example, a thinner inorganic layer is easier to form, and in another example a thicker inorganic layer facilitates better protection of the light emitting device 100. Generally speaking, a transmittance of the protective layer 130 with respect to red light may be 50% or higher for better optical performance. A transmittance of the protective layer 130 with respect to green light may be 30% or higher for better optical performance. A transmittance of the protective layer 130 with respect to blue light may be 24% or higher for better optical performance.

An inorganic layer may comprise an insulating material or a conductive material. An insulating material, for example a distributed Bragg reflector (DBR) layer of a thickness of 1000 Å to 1μ, may facilitate the improvement of the optical performance of the light emitting device 100. The protective layer 130 may include one or more insulating inorganic layers.

Referring back to FIG. 1, a conductive material may serve as an auxiliary electrode to facilitate the improvement of IR drop of the electrode layers 111, 112 atop the light emitting elements 110 of the light emitting device 100 in case an insufficient driving voltage owing to long distance causes the IR drop. A conductive material may comprise a metal layer such as a thin silver film of a thickness of 50 Å to 200 Å, an alloy layer such as a thin magnesium-indium film, or a transparent conductive material such as indium tin oxide (ITO) or indium gallium zinc oxide (IGZO). The conductive inorganic layer may be any inorganic layer in the protective layer.

Figure 4:
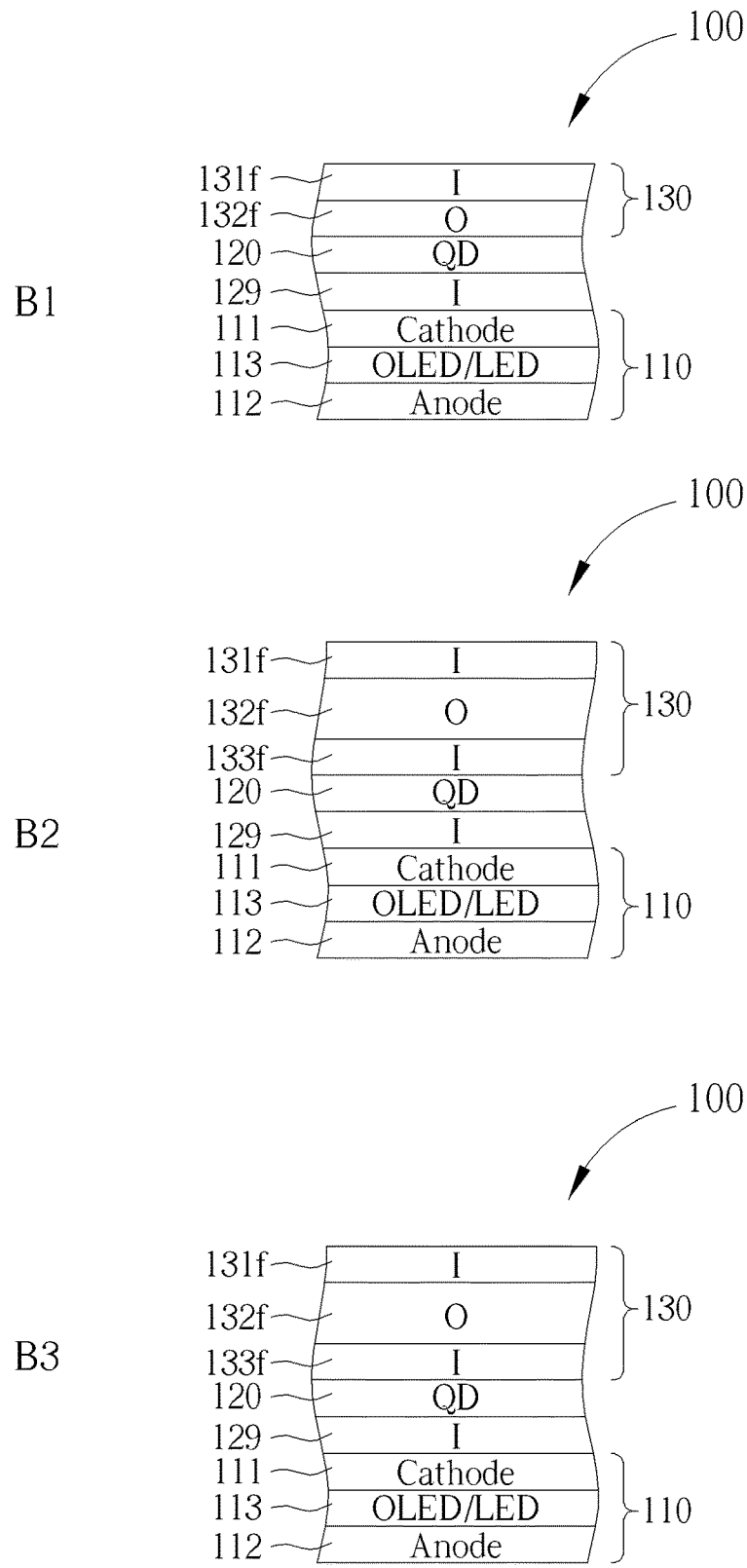
FIG. 4 is a schematic diagram illustrating a cross-sectional view of a light emitting device according to other variant embodiments of the present disclosure.

FIG. 4 is a schematic diagram illustrating a cross-sectional view of a light emitting device 100 according to variant embodiments of the present disclosure. In one variant embodiment B1, the protective layer 130 may include a distributed Bragg reflector (DBR) layer 131f and an organic color filter 132f. This simple configuration in one aspect has both the benefits of DBR layer and the color filter to improve the optical performance of the light emitting device 100 and in another aspect helps simplify the process to manufacture the light emitting device 100. There may be the inorganic layer 129 disposed between the protective layer 130 and the light emitting elements 110.

In another variant embodiment B2, the protective layer 130 may include a DBR layer 131f, an inorganic electric conductive layer 133f and an organic color filter 132f which is sandwiched between the DBR layer 131f and the inorganic electric conductive layer 133f. This simple configuration in one aspect has the benefits of the DBR layer and the color filter to improve the optical performance of the light emitting device 100, the benefit of the conductive layer to improve the problem of IR drop of the electrode layers 111, 112 of the light emitting device 100, and in another aspect helps simplify the process to manufacture the light emitting device 100. Instill another variant embodiment B3, the protective layer 130 may include a couple of DBR layers 131f, 133f to forma gain resonator. This configuration helps form laser-like output light and facilitates better optical performance of the light emitting device 100.

The topmost layer of the protective layer 130 may comprise either an organic material or an inorganic layer. The bottommost layer of the protective layer may comprise either an organic material or an inorganic layer. A protective layer 130 may include a couple of DBR layers for the concentration of the wavelength of the output of the light of the light emitting device 110.

Figure 5:
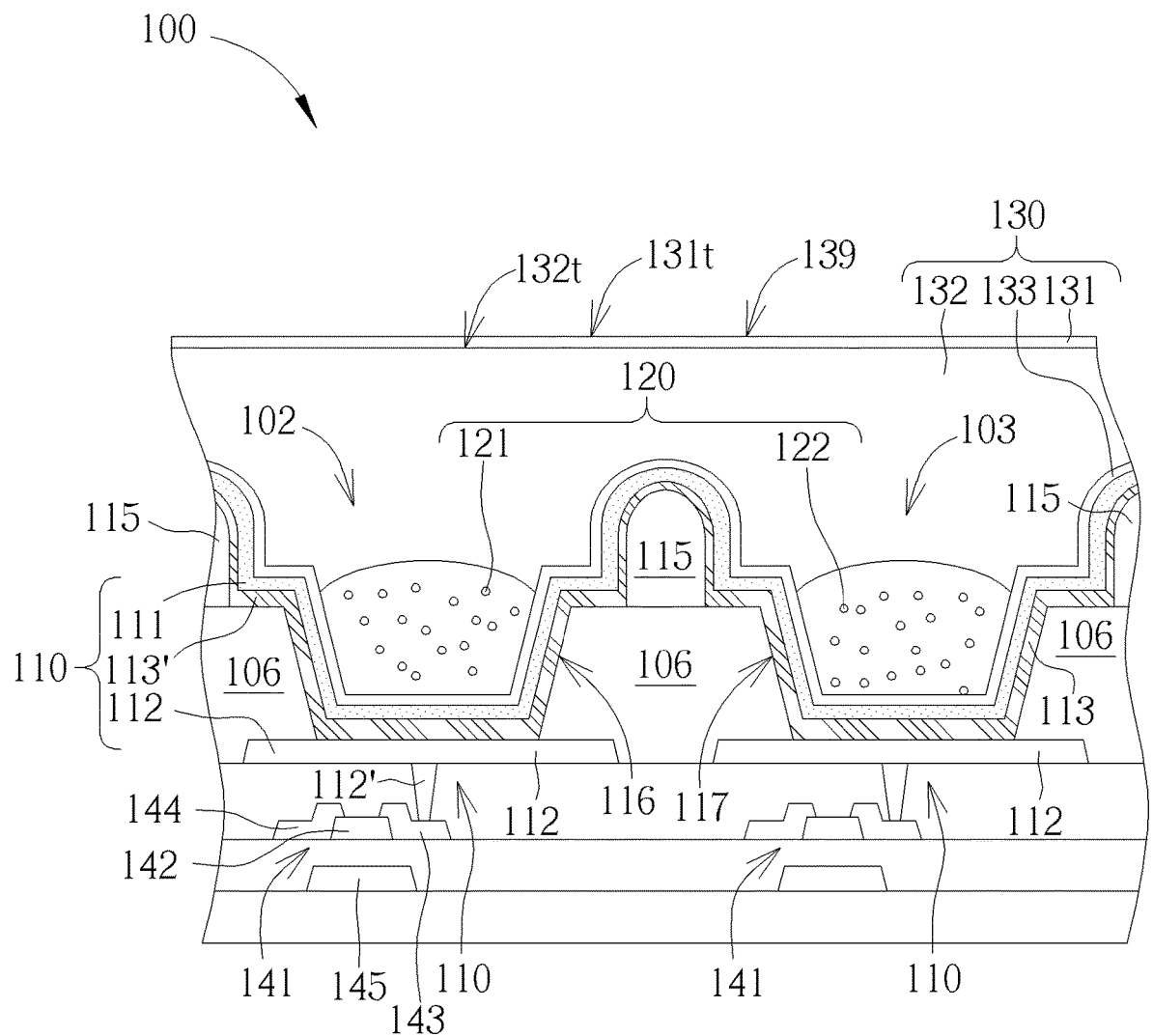
FIG. 5 is a schematic diagram illustrating a cross-sectional view of a plurality of light emitting elements in a light emitting device according to another embodiment of the present disclosure.

Referring to FIG. 5 and FIG. 1, FIG. 5 is a schematic diagram illustrating a cross-sectional view of a plurality of light emitting elements 110 in a light emitting device 100 according to another embodiment of the present disclosure. In one embodiment, a plurality of color conversion elements 120 are disposed on a bulk layer 113' which serve as a light emitting layer. This configuration helps simplify the process to manufacture the light emitting device 100 by omitting a mask to define the pattern of the light emitting elements 110. In another variant embodiment, a plurality of color conversion elements 120 are disposed on a corresponding light emitting layer 113, namely a side-by-side structure and the formation of the spacers 115 is prior to the formation of the light emitting layers 113, so the light emitting layer 113 is continuous atop of the spacers 115 and the color conversion elements 120 are segregated by the pixel defining layer (PDL) 106. In still another embodiment, the spacers 115 may be optionally disposed atop of the first electrode 111, of the light emitting layer 113 and of the protective layer 130. The formation of spacers 115 may avoid the overflow of a quantum dot material before curing.

Figure 6:
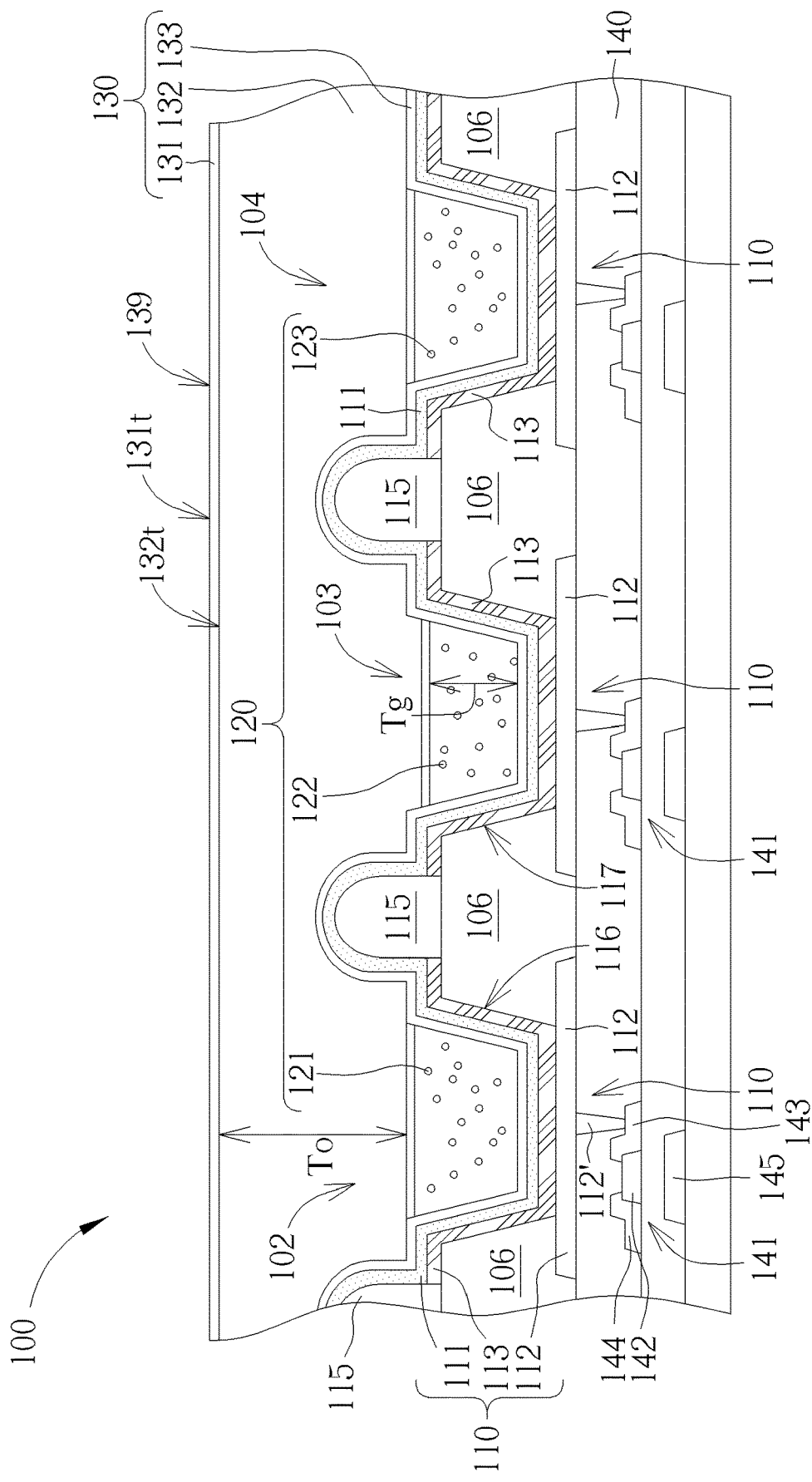
FIG. 6 is a schematic diagram illustrating a cross-sectional view of a plurality of quantum dots in a light emitting device according to another embodiment of the present disclosure.

Referring to FIG. 6 and FIG. 1, FIG. 6 is a schematic diagram illustrating a cross-sectional view of a plurality of quantum dots 121, 122, 123 in a light emitting device 100 according to another embodiment of the present disclosure.

In the embodiment of FIG. 1, the blue sub-pixel 104 is free of a color conversion element. This configuration helps simplify the process to manufacture the light emitting device by omitting a step to form the color conversion element 120 in the blue sub-pixel 104. In the variant embodiment of FIG. 6, there is a color conversion element 123 disposed in the blue sub-pixel 104. This configuration may help adjust the blue ray composition of the output light or adjust the shift of the wavelength of the blue sub-pixel 104.

Figure 7:
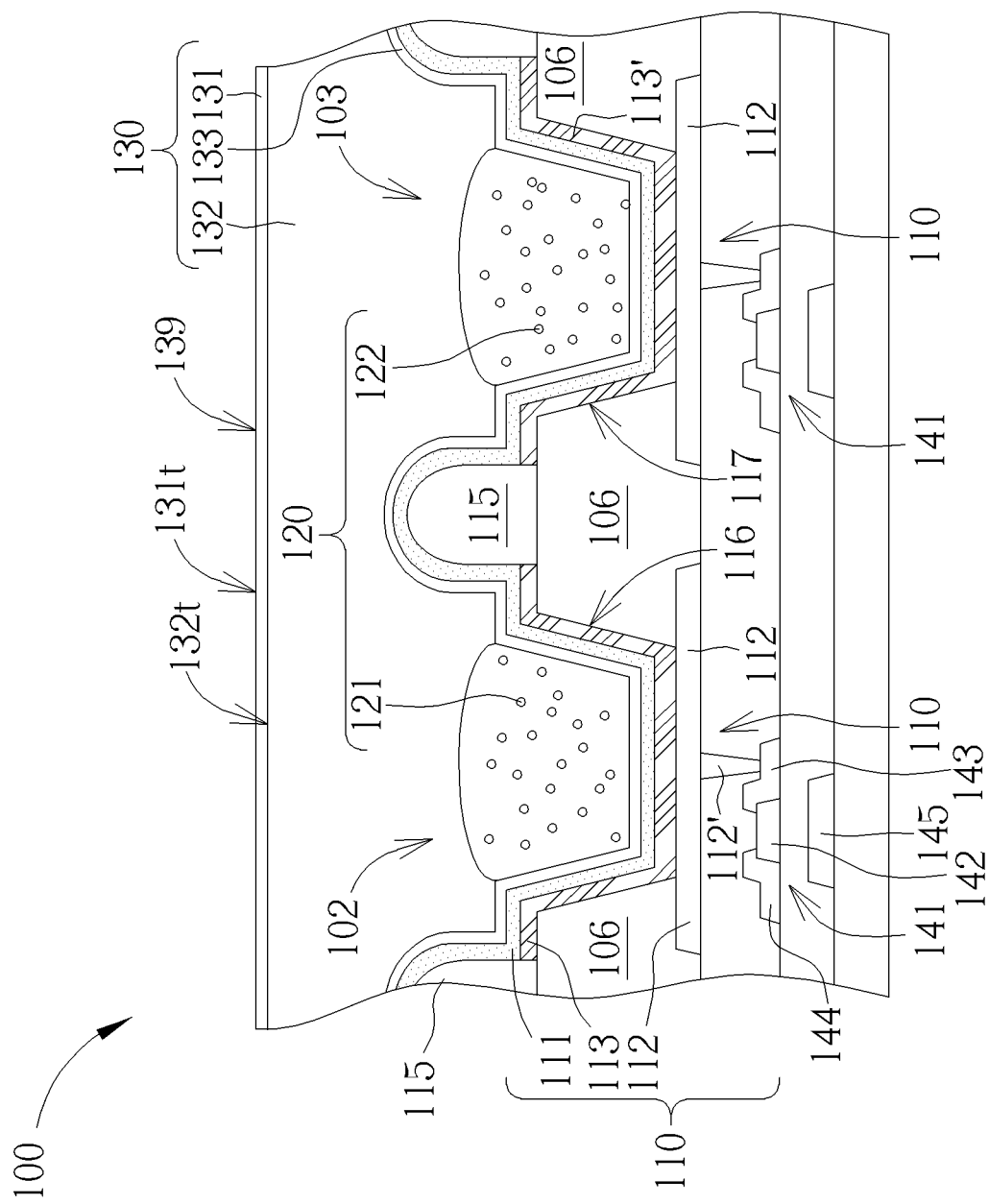
FIG. 7 is a schematic diagram illustrating a cross-sectional view of a light emitting device according to another embodiment of the present disclosure.

Please refer to FIG. 5 and FIG. 7. FIG. 7 is a schematic diagram illustrating a cross-sectional view of a light emitting device 100 according to another embodiment of the present disclosure. In one variant embodiment of FIG. 5, the light emitting device 100 may have a plurality of cavities 116, 117 to accommodate each different color conversion element 120, such as quantum dots 121, 122 so the color conversion elements 120 are respectively and individually disposed in the cavities 116, 117.

Optionally, each quantum dot 121, 122 may sufficiently fill one cavity, or alternatively in another variant embodiment of FIG. 7, the quantum dots 121, 122 may fill up the cavities 116, 117. If the quantum dots 121, 122 fill up the cavities 116, 117, the spacers 115 nearby help to avoid the problem of the overflow of the quantum dot material before curing. As shown in the figures, the thickness of the organic layer 132 is usually higher than the height of a spacer 115. FIG. 5 illustrates an over-coating blue OLED structure of a continuous light emitting layer. FIG. 7 illustrates a side-by side structure of a discontinuous light emitting layer.

Please refer back to FIG. 1. The organic layer 132 may generally have a thickness To greater than a thickness Tg of the color conversion element 120. For example, if the color conversion elements 120 are disposed in the cavities 116, 117, the organic layer 132 may generally have a thickness To in a range from 2 μm to 50 μm, and the color conversion elements 120, such as the quantum dots 121, 122, may generally have a thickness Tg in a range from 1 μm to 10 μm (measured from the top surface to the bottom surface of the color conversion element 120 accommodated in a cavity 116 or 117). Further, a ratio (Tg/To) of the thickness Tg of a color conversion element 120 to the thickness To of an organic layer 132 may range from 10% to 150%.

Figure 8A:
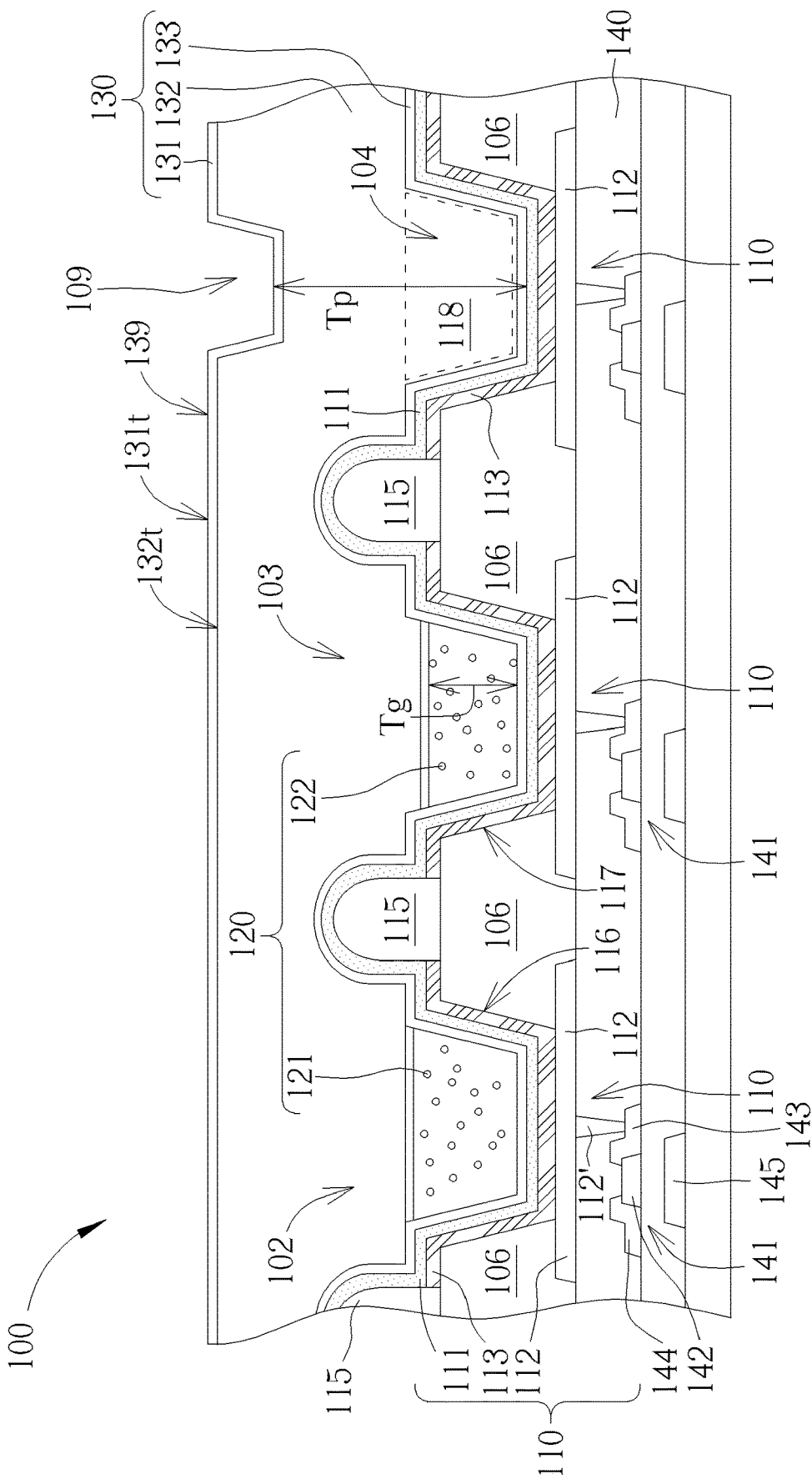
FIG. 8A and FIG. 8B are schematic diagrams illustrating a cross-sectional view of a light emitting device according to another embodiment of the present disclosure.
Figure 8B:
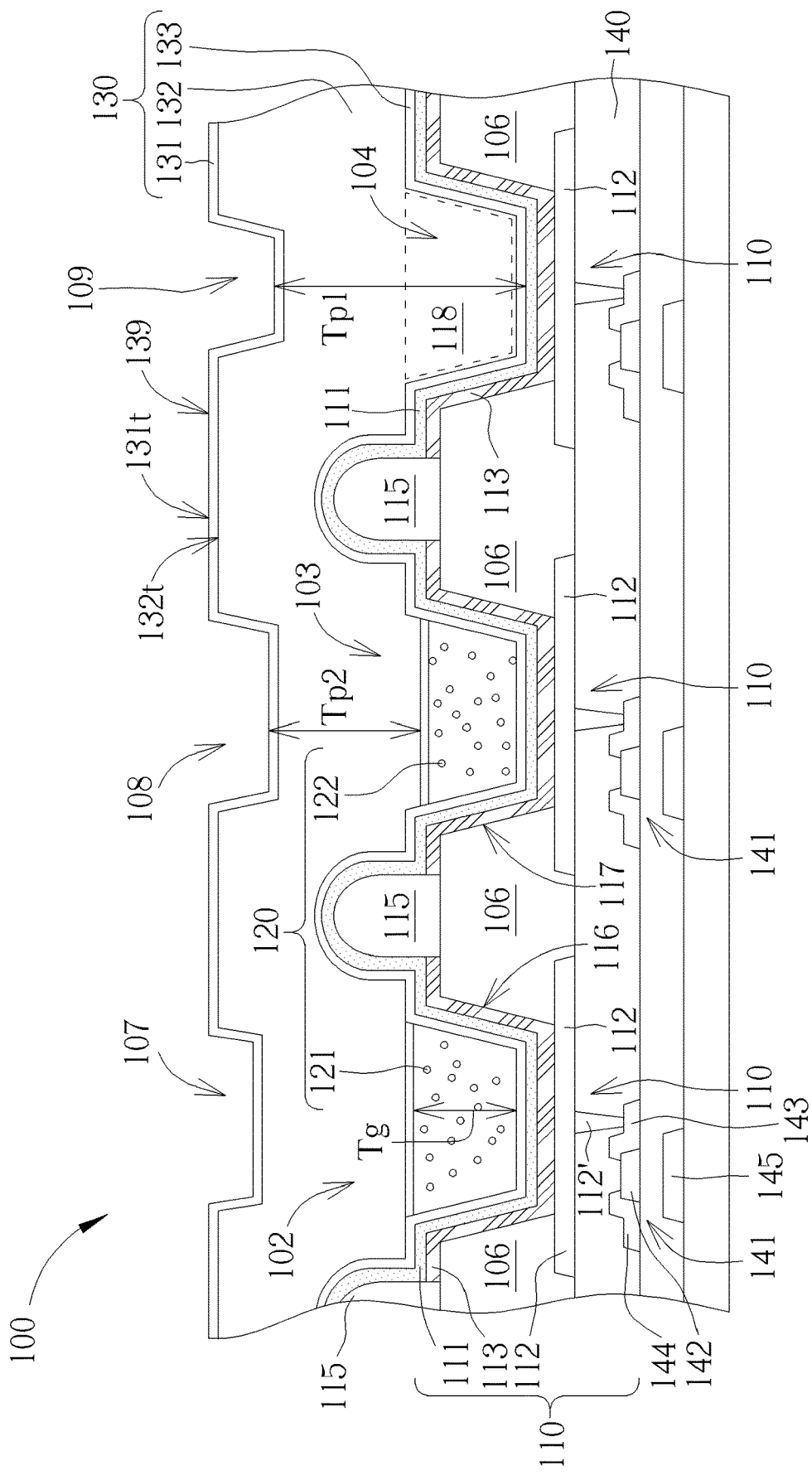

Refer to FIG. 1, FIG. 8A and FIG. 8B, FIG. 8A or FIG. 8B is a schematic diagram illustrating a cross-sectional view of a light emitting device 100 according to another embodiment of the present disclosure. In one variant embodiment of FIG. 1, the protective layer 130 has a top surface 131t, and the top surface 131t may be substantially flat and has no recess to vertically correspond to the sub-pixels 102, 103, 104. The thickness of the protective layer 130 is determined vertically from the top surface 131t of the inorganic layer 131 to the interface of the color conversion element 120 and the inorganic layer 133 in the sub-pixels 102, 103. This configuration helps simplify the process to manufacture the light emitting device 100.

In another variant embodiment of FIG. 8A, the top surface 131t includes a recess 109 to correspond to and overlap a blue sub-pixel 104. The recess 109 helps decrease the regional thickness Tp of the protective layer 130 to increase the intensity of the light so a quantum dot in one sub-pixel may not be needed. If a color conversion element is absent from a cavity 118, the thickness Tp of the protective layer 130 is determined vertically from the bottom of the cavity 118 to the top surface 131t in a blue sub-pixel 104. In an embodiment, different sub-pixels may accordingly have different ratios (Tg/Tp) with or without the recess or the cavity.

In another variant embodiment of FIG. 8B, the top surface 131t includes a plurality of recesses 107, 108, 109 to correspond to and overlap different sub-pixels such as a red sub-pixel 102, a green sub-pixel 103 or a blue sub-pixel 104 respectively. The recesses 107, 108, 109 help decrease the regional thickness Tp1 of the protective layer 130 to increase the intensity of the light so double light emitting elements in one sub-pixel may not be needed. If a color conversion element 120 is present in a cavity 117, the thickness Tp2 of the protective layer 130 is determined vertically from the inorganic layer 129 to the top surface 131t in a red sub-pixel 102 or a green sub-pixel 103. When Tp1>Tp2, the intensity of the blue light of the blue sub-pixel 104 would be stronger because the blue light of the blue sub-pixel 104 does not pass quantum dots. When Tp2>Tp1, the output light of the blue sub-pixel 104 is less bluish because a thicker Tp2 consumes more blue light.

Figure 9:
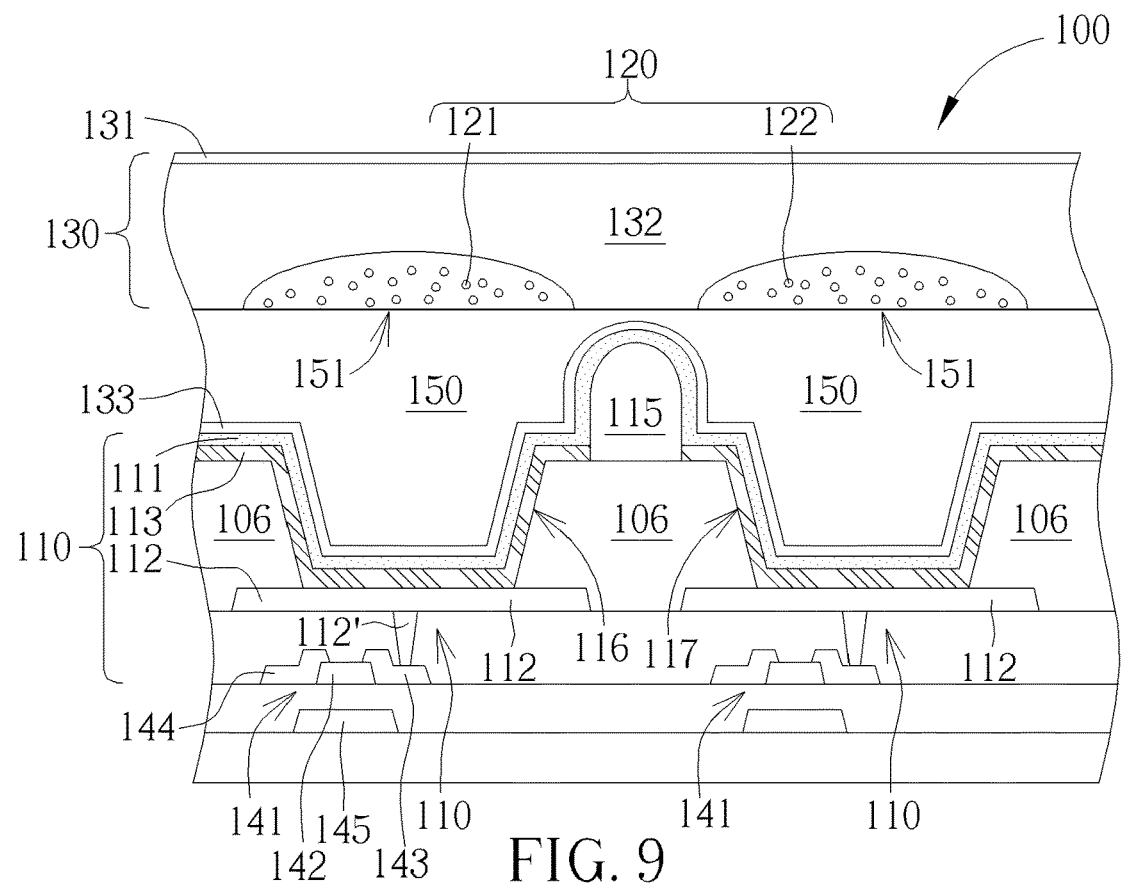
FIG. 9 is a schematic diagram illustrating a cross-sectional view of a light emitting device according to another embodiment of the present disclosure.

FIG. 9 is a schematic diagram illustrating a cross-sectional view of a light emitting device 100 according to another embodiment of the present disclosure. In one embodiment, the color conversion elements 120 are disposed on a surface 151 of a planarization layer 150. The planarization layer 150 fills up the cavities 116, 117 and has a top surface 151. Each color conversion element 120, such as quantum dots 121, 122, is in direct contact with the top surface 151 and completely covered by the organic layer 132. Because the quantum dots 121, 122, are not disposed in the cavities 116, 117, variable depth of the cavities 116, 117 to jeopardize the optical performance of the light emitting device 110 may be accordingly avoided. In FIG. 9, a quantum dot 121 or 122 is not accommodated in a cavity 116, 117 and the planarization layer 150 fills the cavities 116, 117. The suitable material for the planarization layer 150 may comprise an inorganic material, such as silicon oxide, silicon nitride, silicon oxynitride, metal oxide, or an organic material, such as polyimide, acrylate, epoxy, poly(methyl methacrylate), benzocyclobutene or polyester).

Please refer to FIG. 10A, FIG. 10B, FIG. 10C, FIG. 10D, FIG. 10E, FIG. 10F, FIG. 10G and FIG. 10H. FIG. 10A, FIG. 10B, FIG. 10C, FIG. 10D, FIG. 10E, FIG. 10F, FIG. 10G or FIG. 10H is a schematic diagram illustrating a cross-sectional view of a light emitting device 100 according to another embodiment of the present disclosure. The optional black matrixes 160 are present in the light emitting device 100 of the embodiments. The optional black matrixes 160 may be disposed between two adjacent sub-pixels and may help avoid the cross-talk of light from the neighboring sub-pixels.

Figure 10A:
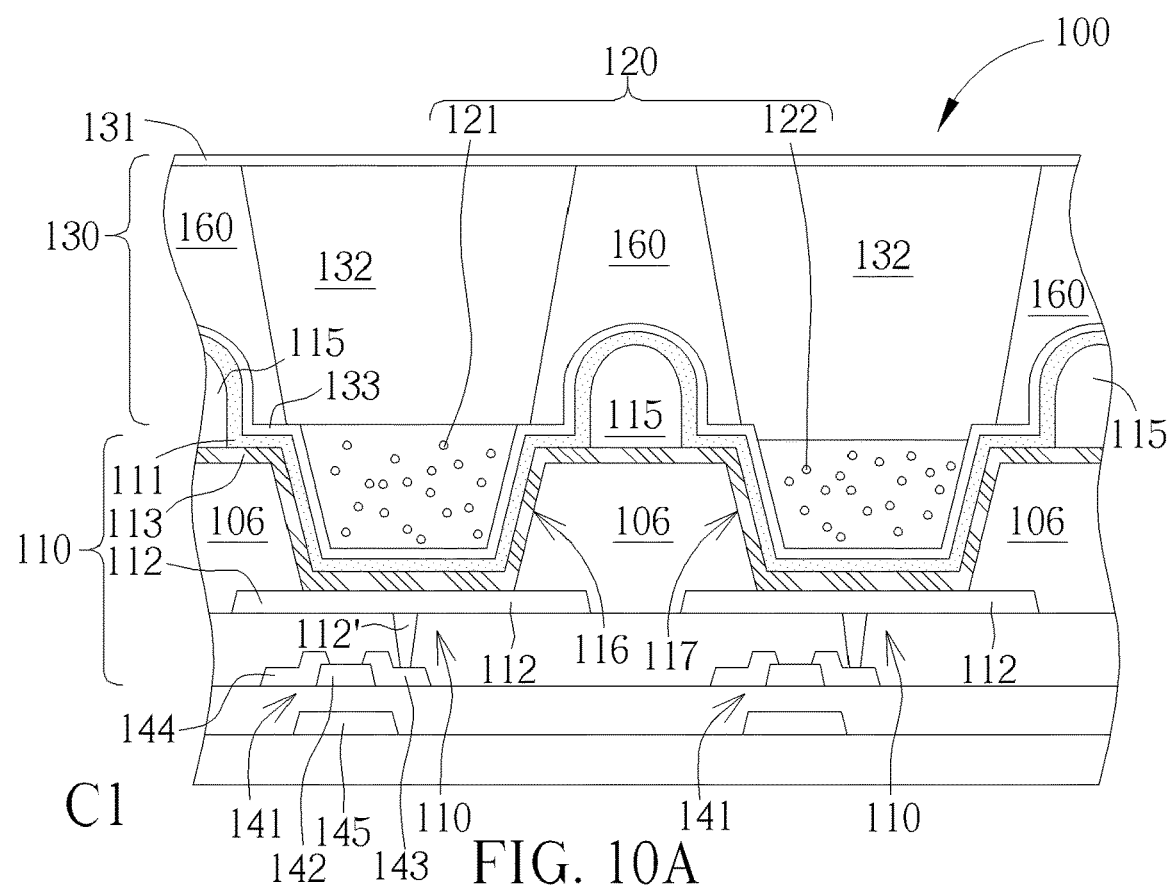
FIG. 10A, FIG. 10B, FIG. 10C, FIG. 10D, FIG. 10E, FIG. 10F, FIG. 10G and FIG. 10H are schematic diagrams illustrating a cross-sectional view of a light emitting device according to another embodiment of the present disclosure.
Figure 10B:
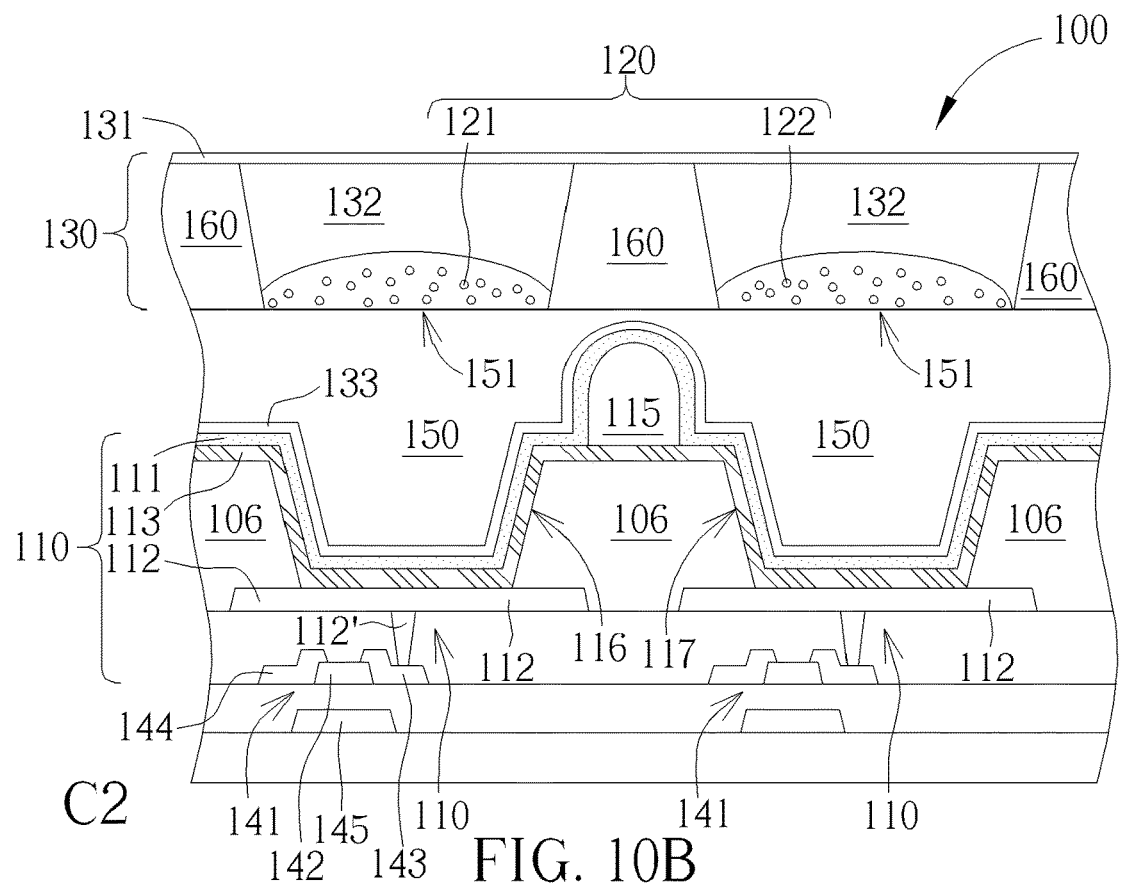

For example, in a variant embodiment C1 of FIG. 10A, the black matrixes 160 are disposed in the organic layer 132 and above the color conversion elements 120. The black matrixes 160 are in a shape of a trapezoid. Or in a variant embodiment C2 of FIG. 10B, both the black matrixes 160 and the color conversion elements 120 are disposed in the organic layer 132 and above a planarization layer 150 so the black matrixes 160 are in direct contact with the color conversion elements 120, with the planarization layer 150 and with the organic layer 132. In FIG. 10B, the quantum dot 121 or 122 is not accommodated in a cavity 116 or 117 and the planarization layer 160 fills up the cavities 116, 117. Further, the black matrixes 160 are disposed between two adjacent quantum dots.

Figure 10C:
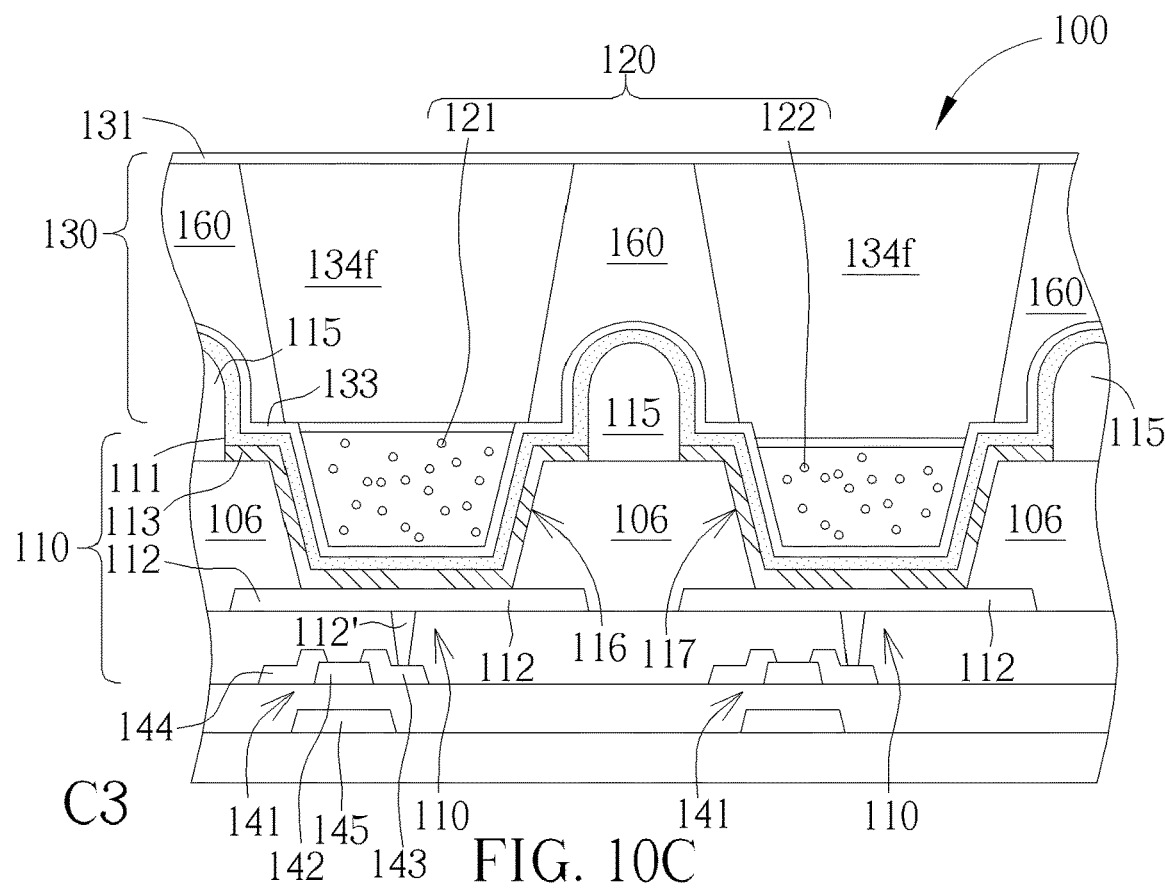
Figure 10D:
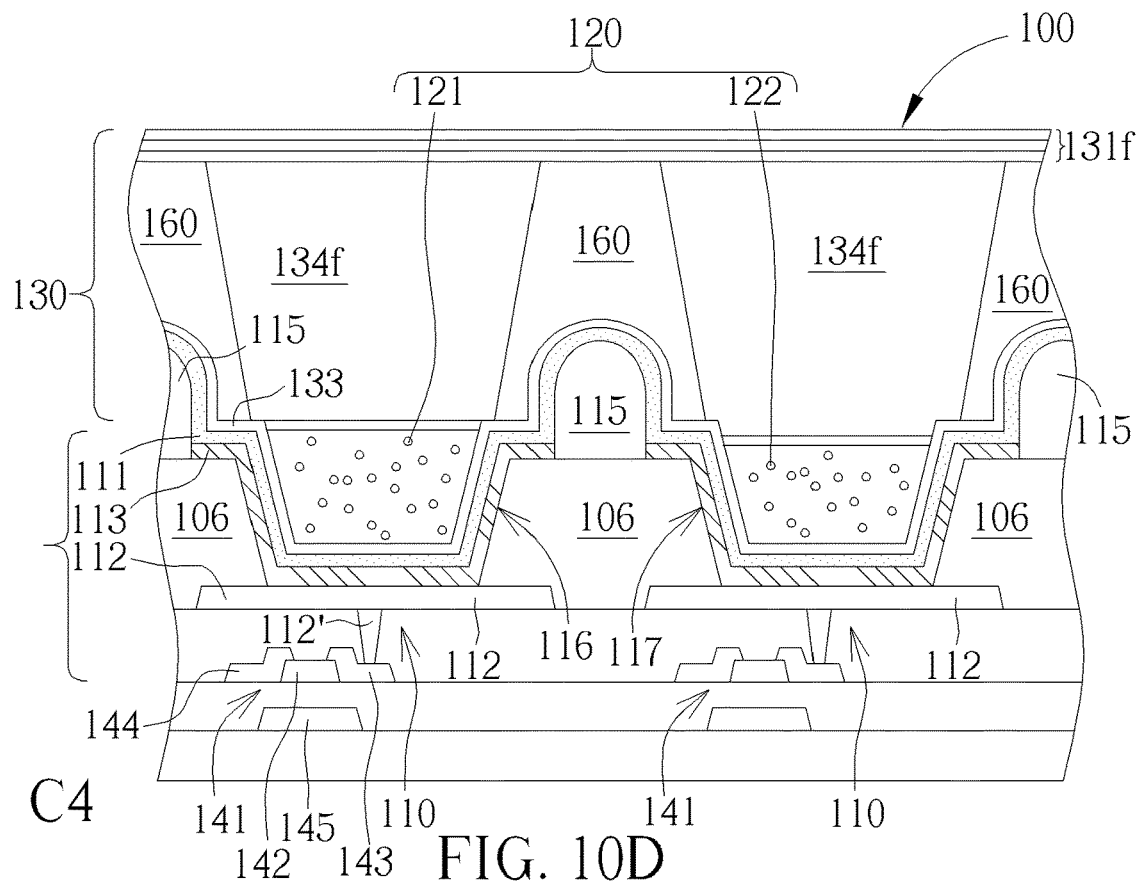

Or in a variant embodiment C3 of FIG. 10C, if the color filters 134f serve as the organic layer, the black matrixes 160 are sandwiched between two adjacent color filters 134f. Each black matrix 160 is disposed atop a corresponding spacer 115 and a color filter 134f is disposed atop a corresponding light emitting element 110 and in direct contact with the color conversion elements 120. The black matrixes 160 are in a shape of a trapezoid. Moreover, the color filters 134f and the black matrixes 160 together are arranged in a lateral direction with each other. This configuration helps simplify the process to manufacture the light emitting device. Or in a variant embodiment C4 of FIG. 10D, the DBR layer 131f may serve as a topmost layer. The introduction of the DBR layer 131f may help improve the optical performance of the light emitting device 100.

Figure 10E:
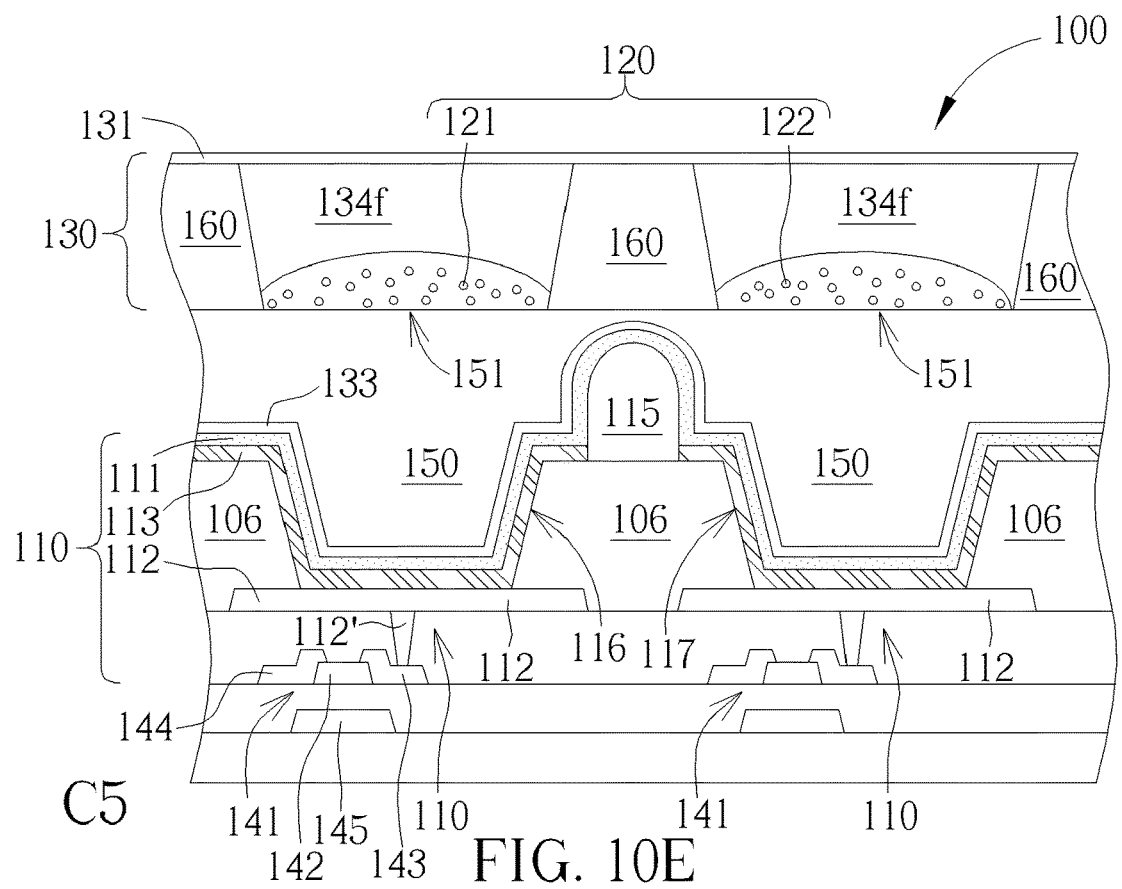

Or in a variant embodiment C5 of FIG. 10E, if the color filters 134f serve as the organic layer and the color conversion elements 120 are disposed on the planarization layer 150, the black matrixes 160 are sandwiched between two adjacent color filters 134f, or between two adjacent quantum dots 121 and 122. Each black matrix 160 is disposed atop the planarization layer 150 and each color filter 134f is disposed atop the planarization layer 150, too. The black matrixes 160 are in a shape of a trapezoid. This configuration helps provide a better light path.

Figure 10F:
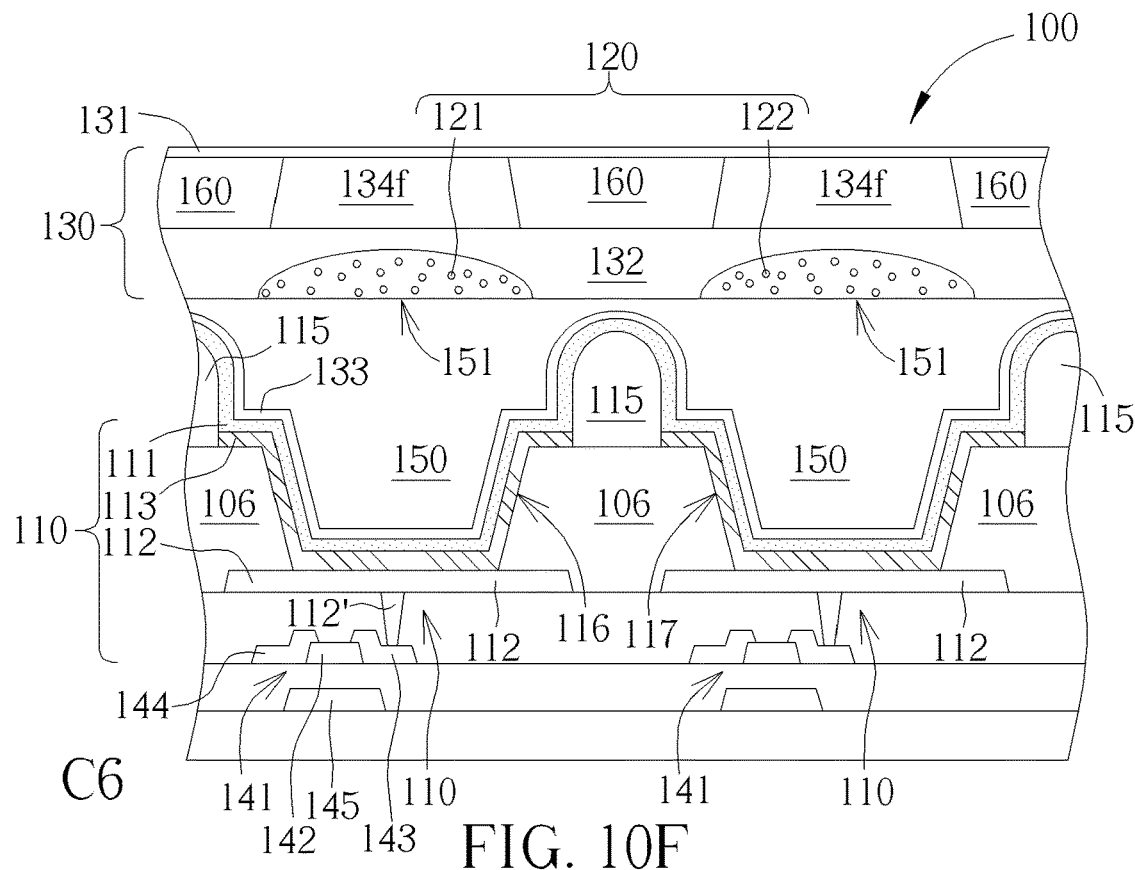
Figure 10G:
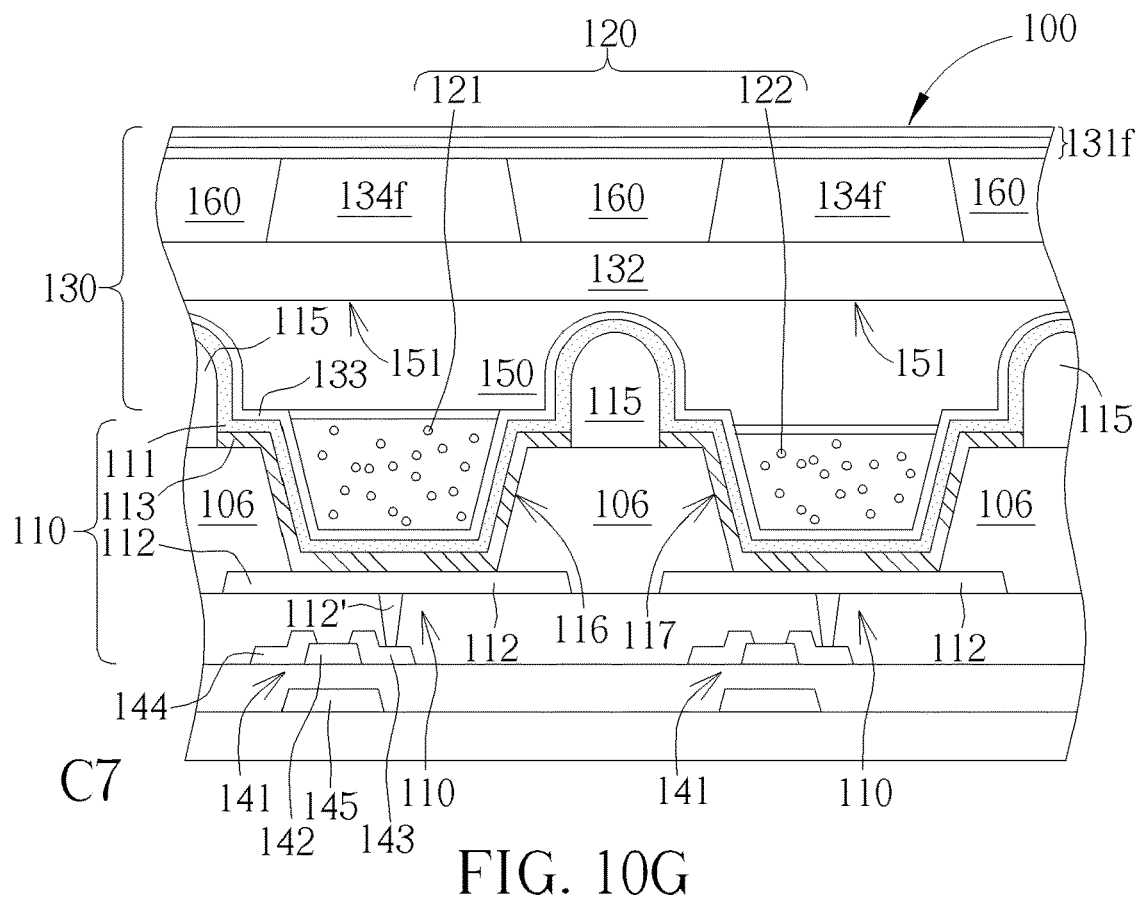

Or in a variant embodiment C6 of FIG. 10F, if both the color filters 134f and the organic layer 132 are present and the color conversion elements 120 are disposed under the organic layer 132, both the color filters 134f and the black matrixes 160 are disposed atop the organic layer 132. The black matrixes 160 are sandwiched between two adjacent color filters 134f and in a shape of an inverted trapezoid. Both the color filters 134f and the organic layer 132 provide protection so this configuration facilitates a robust protective layer. Or in a variant embodiment C7 of FIG. 10G, the variant embodiment C6 may further include a DBR layer 131f to serve as a topmost layer. The introduction of the DBR layer 131f helps improve the optical performance of the light emitting device 100.

Figure 10H:
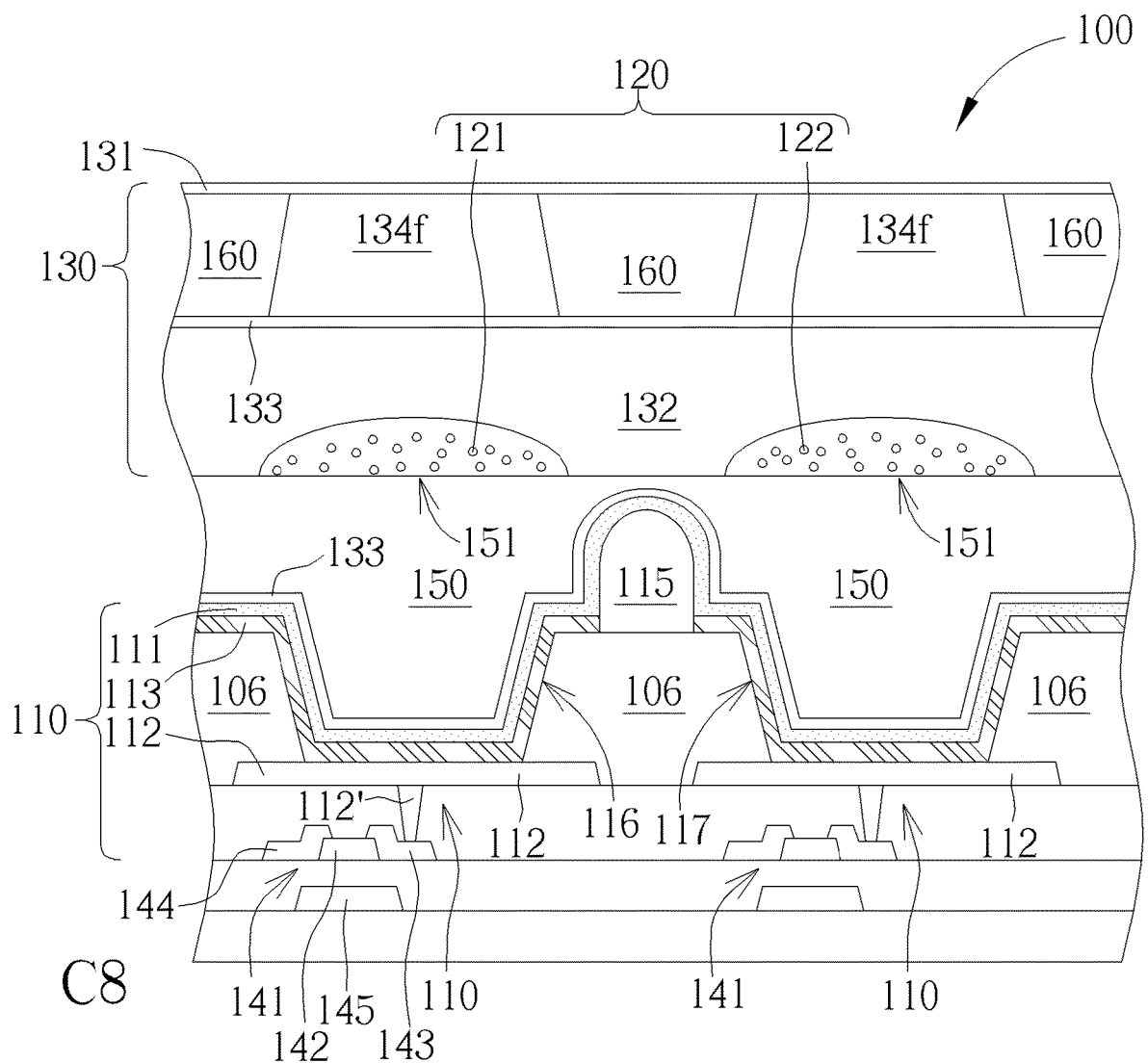

Or in a variant embodiment C8 of FIG. 10H, if both the color filters 134f and the organic layer 132 are present and the color conversion elements 120 are disposed on the planarization layer 150, both the color filters 134f and the black matrixes 160 are disposed atop the organic layer 132, and both the organic layer 132 and the color conversion elements 120 are disposed atop the planarization layer 150. The black matrixes 160 are in a shape of an inverted trapezoid. This configuration also facilitates a robust protective layer.

Please refer back to FIG. 3. The light emitting device 100 may further comprise a blue light blocking layer disposed on the topmost inorganic layer I, as shown in the variant embodiment A5 or in the variant embodiment A5'. Because the conversion efficiency of a color conversion element 120 is not 100%, a portion of the light which is emitted from the light emitting element 120 may not be completely converted by the above color conversion element 120, so the spectrum of the output light of a sub-pixel may include a target wave and a sub-wave. The target wave may represent the converted light and the sub-wave may represent the unconverted light. The sub-wave in the output light jeopardizes the optical performance of the light emitting device 100.

In the present disclosure, an optional blue light blocking layer may help to block the leaking sub-wave in the output light. The blue light blocking layer may be a color filter layer 134f or a DBR layer 131f. In another variant embodiment, the blue light blocking layer may be the topmost layer of the protective layer 130.

Table 1 demonstrates that various structural types may be optionally combined to results in variant embodiments.

| | Type I | Type II | Type III |
|---|---|---|---|
| Light emitting layer | | bulk layer | side-by-side |
| black matrix | | present | absent |
| blue light blocking layer | | color filter | DBR |
| colorless organic layer | | present | absent |
| planarization layer | | present | absent |
| recess | | present | absent |

In summary, the present disclosure provides a QD layer in various QD-OLED structures with a protective multilayer structure. This novel protection structure renders the fragile quantum dots in a QD-OLED light emitting device well protected to have robust resistance to light, to heat, to moist, to oxygen and to chemicals so as to overcome the current problems in the industry.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light emitting device, comprising:
a plurality of light emitting elements;
a plurality of color conversion elements disposed on at least a portion of the plurality of light emitting elements; and
a protective layer disposed on the plurality of color conversion elements;
a pixel defining layer, wherein at least two of the plurality of the color conversion element are segregated by the pixel defining layer;
at least one of a plurality of spacers disposed corresponding to the pixel defining layer; and
at least one of a plurality of black matrixes disposed corresponding to the at least one of the plurality of spacers,
wherein the protective layer is a multilayer structure, the protective layer comprises a blue light blocking layer, and the blue light blocking layer overlaps at least one of the plurality of color conversion elements.

2. The light emitting device of claim 1, wherein the multilayer structure comprises an organic layer and a first inorganic layer disposed thereon.

3. The light emitting device of claim 2, wherein a thickness of the organic layer is greater than a thickness of the first inorganic layer.

4. The light emitting device of claim 2, wherein the multilayer structure further comprises a second inorganic layer, and the organic layer is disposed between the first inorganic layer and the second inorganic layer.

5. The light emitting device of claim 4, wherein a thickness of the first inorganic layer is different from a thickness of the second inorganic layer.

6. The light emitting device of claim 1, wherein the plurality of color conversion elements are disposed on only the portion of the plurality of light emitting elements.

7. The light emitting device of claim 6, wherein the plurality of color conversion elements output red light, green light, or a combination thereof.

8. The light emitting device of claim 1, wherein the plurality of color conversion elements are disposed on the plurality of light emitting elements respectively.

9. The light emitting device of claim 1, wherein the plurality of light emitting elements emit blue light.

10. The light emitting device of claim 1, wherein the multilayer structure comprises at least one insulating layer.

11. The light emitting device of claim 1, wherein the multilayer structure comprises at least one conductive layer.

12. The light emitting device of claim 1, wherein the protective layer has a top surface, wherein the top surface comprises a plurality of recesses.

13. The light emitting device of claim 12, wherein the plurality of recesses are located corresponding to the plurality of color conversion elements.

14. The light emitting device of claim 1, further comprising:
the blue light blocking layer disposed on the protective layer.

15. The light emitting device of claim 1, further comprising a plurality of cavities, wherein the plurality of color conversion elements are respectively and individually disposed in a plurality of cavities.

16. The light emitting device of claim 1, wherein the plurality of color conversion elements are disposed on a surface of a planarization layer.

17. The light emitting device of claim 1, wherein a thickness of the protect layer is greater than a thickness of one of the plurality of color conversion elements.

18. The light emitting device of claim 1, wherein the protective layer has one or more distributed Bragg reflector layers.

19. The light emitting device of claim 1, wherein the protective layer comprises a distributed Bragg reflector layer and an organic color filter.

20. The light emitting device of claim 1, wherein the protective layer comprises a distributed Bragg reflector (DBR) layer, an inorganic electric conductive layer and an organic color filter which is sandwiched between the DBR layer and the inorganic electric conductive layer.

* * * * *